United States Patent
Endou et al.

(10) Patent No.: US 9,171,244 B2
(45) Date of Patent: Oct. 27, 2015

(54) RFID TAG

(71) Applicant: HITACHI CHEMICAL COMPANY, LTD., Tokyo (JP)

(72) Inventors: Toshihiro Endou, Oyama (JP); Hironori Ishizaka, Yuuki (JP); Masahiko Oota, Oyama (JP); Kouji Tasaki, Chikusei (JP); Hiroyuki Hosoi, Higashikurume (JP); Jo Kakuta, Goshogawara (JP); Hiroaki Narita, Aomori (JP); Hiroki Sato, Aomori (JP)

(73) Assignee: HITACHI CHEMICAL COMPANY, LTD., Tokyo (JP)

(*) Notice: Subject to any disclaimer, the term of this patent is extended or adjusted under 35 U.S.C. 154(b) by 0 days.

(21) Appl. No.: 14/345,688

(22) PCT Filed: Sep. 27, 2012

(86) PCT No.: PCT/JP2012/074932
§ 371 (c)(1),
(2) Date: Mar. 19, 2014

(87) PCT Pub. No.: WO2013/047680
PCT Pub. Date: Apr. 4, 2013

(65) Prior Publication Data
US 2014/0224887 A1    Aug. 14, 2014

(30) Foreign Application Priority Data

Sep. 30, 2011    (JP) .................. 2011-217165

(51) Int. Cl.
*G06K 19/077* (2006.01)
*H01Q 7/00* (2006.01)
(Continued)

(52) U.S. Cl.
CPC .... *G06K 19/07754* (2013.01); *G06K 19/07749* (2013.01); *G06K 19/07775* (2013.01);
(Continued)

(58) Field of Classification Search
CPC .......... H01L 2224/32225; H01L 2224/48227; H01L 2224/73265; H01L 2224/48091; H01L 2924/00014; H01L 21/56; H01L 23/3142; H01L 2224/48247; G06K 19/07754; G06K 19/07775; G06K 19/07783; G06K 19/07749; H01Q 1/36; H01Q 1/44; H01Q 1/40; H01Q 1/2208; H01Q 7/00; H01Q 9/26
See application file for complete search history.

(56) References Cited

U.S. PATENT DOCUMENTS

| | | | |
|---|---|---|---|
| 7,883,021 B2 * | 2/2011 | Iwakata et al. | 235/492 |
| 2006/0009251 A1 | 1/2006 | Noda | |
| 2008/0164326 A1 | 7/2008 | Iwakata et al. | |

FOREIGN PATENT DOCUMENTS

| | | |
|---|---|---|
| JP | 2000-276569 | 10/2000 |
| JP | 2001-52137 | 2/2001 |

(Continued)

OTHER PUBLICATIONS

Notification of Transmittal of Copies of Translation of the International Preliminary Report on Patentability, mailed Apr. 10, 2014, for International Application No. PCT/JP2012/074932.

(Continued)

*Primary Examiner* — Sonji Johnson
(74) *Attorney, Agent, or Firm* — Fitch, Even, Tabin & Flannery, LLP

(57) ABSTRACT

Provided is an RFID tag, wherein a communication distance of several centimeter or more can be secured and the cost of which can be reduced in comparison to conventional on-chip antennas, even when being compact in size (square shaped with a side of 1.9 to 13 mm). The RFID tag (80) comprises an antenna (20), an IC chip (30) connected to the antenna (20), and a sealing material (10) that seals the IC chip (30) and the antenna (20). The antenna (20) is a coil antenna or a loop antenna, and the resonance frequency ($f_0$) of an electric circuit constituted by the inductance (L) of the antenna (20) and the capacitance (C) of the IC chip (30) is equal to the operation frequency of the IC chip (30), or in the vicinity thereof.

23 Claims, 4 Drawing Sheets

(51) Int. Cl.
  *H01Q 9/26* (2006.01)
  *H01Q 1/22* (2006.01)
  *H01L 21/56* (2006.01)
  *H01L 23/31* (2006.01)
  *H01Q 1/36* (2006.01)
  *H01Q 1/40* (2006.01)
  *H01Q 1/44* (2006.01)

(52) U.S. Cl.
  CPC .......... *G06K19/07783* (2013.01); *H01L 21/56* (2013.01); *H01L 23/3142* (2013.01); *H01Q 1/2208* (2013.01); *H01Q 1/36* (2013.01); *H01Q 1/40* (2013.01); *H01Q 1/44* (2013.01); *H01Q 7/00* (2013.01); *H01Q 9/26* (2013.01); *H01L 2224/48091* (2013.01); *H01L 2224/48247* (2013.01)

(56) References Cited

FOREIGN PATENT DOCUMENTS

| | | |
|---|---|---|
| JP | 2001-344464 | 12/2001 |
| JP | 2005-56221 | 3/2005 |
| JP | 2005056221 A * | 3/2005 ........... G06K 19/077 |
| JP | 2005-347635 | 12/2005 |
| JP | 2006-24087 A | 1/2006 |
| JP | 2006-189961 | 7/2006 |
| JP | 2006-221211 | 8/2006 |
| JP | 2007-102348 | 4/2007 |
| JP | 2008-165678 | 7/2008 |
| JP | 2010-152449 | 7/2010 |
| JP | 2011-103060 | 5/2011 |
| JP | 2011-159324 A | 8/2011 |

OTHER PUBLICATIONS

Japanese Official Action dated Aug. 26, 2014, for JP Application No. 2013-536394.

KR office action of appln. No. 10-2014-7010276 dated May 21, 2015 with English translation.

* cited by examiner

RFID TAG

TECHNICAL FIELD

The present invention relates to a radio frequency identification (RFID) tag transmitting and receiving information in non contact manner in cooperation with a reader/writer.

BACKGROUND ART

For the purpose of identifying and managing product information and preventing counterfeiting, many non-contact RFID tags including IC chips are used in commercial goods, packages, cards, documents, and the like. IC chips includes relevant information such as name and price of commercial goods. In some IC chips, information such as manufacturing date and factory or balance can be written by a reader/writer at a later date as needed. The information written in IC chips is read by a reader/writer to be used for management, sale, and use of commercial goods. In such a manner, the RFID tags have great benefits in increasing the convenience of merchandise management, increasing security, and preventing human errors (see Patent Literature 1).

RFID tags are usually attached to products or incorporated in cards. Accordingly, the RFID tags are strongly required to be compact and thin. In recent years, RFID tags have attracted attentions for use in products and the like which are conventionally managed with engraved or written lot numbers or are not managed in particular. Specifically, RFID tags have attracted attentions for use in management of high-variety small products such as glasses, watches, and medical samples. The RFID tags are helpful for management of factories, workers, manufacture dates, used materials, dimensions, properties, and stocks of commercial goods (samples). Accordingly, the RFID tags can reduce the trouble of management workers and prevent mistakes. For implementing such a convenient management system, RFID tags need to be miniaturized.

As such compact RFID tags, there is an RFID which includes an antenna (on-chip antenna) directly formed on an IC chip as illustrated in FIG. 1 but has a problem of short communication distance (not more than 1 mm). Compared with RFID tags which have communication distances of not more than 1 mm and can communicate only in substantially contact manner. RFID tags having communication distances of 2 to 3 mm or more provide better work efficiencies and higher work flexibility and are useful in sites where the RFID tags are actually used. In order to increase the communication distance of an on-chip antenna illustrated in FIG. 1, it is necessary to increase the size of the IC chip, which can increase the cost (see Patent Literatures 2 and 3).

On the other hand, as the RFID tags having comparatively long communication distances (2 to 3 mm or more), an RFID tag is used which includes an antenna formed on a film material and an IC chip mounted on the same as illustrated in FIG. 2 but has a problem of large size (a several cm square or larger) (see Patent Literature 4). The several cm square refers to a square 2 to 3 cm on a side. The same applies hereinafter.

On the other hand, some techniques to form an antenna within an IC package, which are excellent in mass production, are reported (see Patent Literatures 5 and 6).

CITATION LIST

Patent Literature

Patent Literature 1: Japanese Patent Laid-open Publication No. 2005-347635
Patent Literature 2: Japanese Patent Laid-open Publication No. 2001-344464
Patent Literature 3: Japanese Patent Laid-open Publication No. 2006-221211
Patent Literature 4: Japanese Patent Laid-open Publication No. 2011-103060
Patent Literature 5: Japanese Patent Laid-open Publication No. 2001-52137
Patent Literature 6: Japanese Patent Laid-open Publication No. 2010-152449

SUMMARY OF INVENTION

Problem to be Solved by Invention

RFID tags having a size in the order of several mm square and a communication distance in the order of several cm square, which is 10 times the size, have a high utility value in industry but are not conventionally provided.

The present invention is to provide a cheap ultra-compact RFID tag which has a communication distance of several mm or longer and is excellent in reliability.

Means for Solving Problems

In order to solve the aforementioned problems, the present invention provides an RFID tag which is compact (1.9 to 13 mm square), can ensure a communication distance of several cm or more, and can be provided at lower cost than the conventional on-chip antennas. Moreover, the present invention provides an RFID tag which is resistant to heat of 250 to 300° C. for several seconds at solder reflow and injection molding performed in the manufacturing process of semiconductor devices or resistant to heat generated by semiconductor devices which are in use.

The RFID tag 80 with a size of not larger than 1.0 to 13 mm square is obtained by forming a pattern with a resist 100 on a stainless plate 90, providing metal to be formed into an antenna 20 and the like in portions not including the resist 100 by plating, removing the resist 100, mounting an IC chip 30 to electrically connect the IC chip 30 and antenna 30, sealing the antenna 20 and the IC chip 30 with a sealing material 10, separating only the stainless plate 90, and cutting the thus-obtained product by dicing or the like.

In this process, the antenna 20 is designed so that the resonant frequency of the electric circuit composed of the inductance of the antenna 20 and the capacitance of the IC chip 30 is close to the operation frequency of the IC chip 30.

The antenna 20 is designed to have a coil shape in particular. This facilitates design of the electric circuit as an LC resonant circuit and can efficiently yield the inductance with a small area, thus miniaturizing the antenna 20.

Moreover, the sealing material 10 is mainly composed of epoxy, carbon, and silica to enhance the heat resistance.

Effect of Invention

It is possible to provide an RFID tag which is compact (1.9 to 13 mm square), can ensure a communication distance of several cm or more, and can be provided at lower cost than conventional on-chip antennas.

MODES FOR CARRYING OUT INVENTION

Hereinafter, a description is given of a method of manufacturing an RFID tag 80 as an embodiment, mainly a method of forming an antenna 20 within a sealing material 10.

Figure 1:
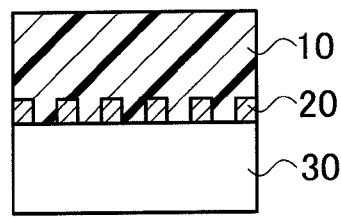
FIG. 1 is a schematic view of a conventional RFID tag.
Figure 2:
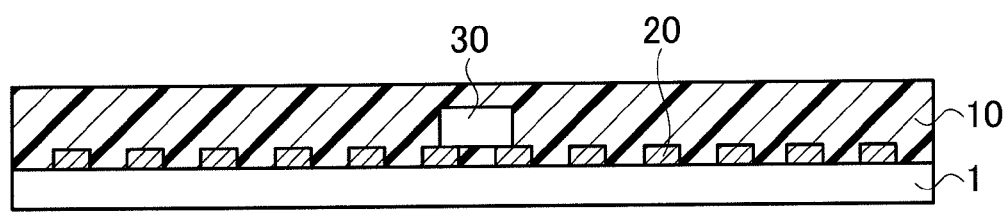
FIG. 2 is a schematic view of a conventional RFID tag.
Figure 3:
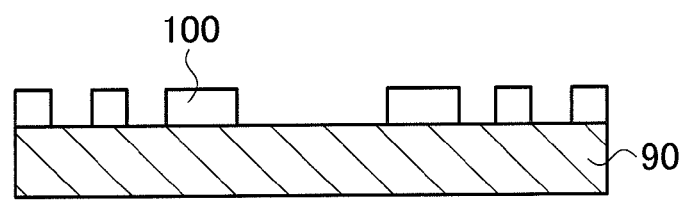
FIG. 3 is a view for explaining a method of manufacturing an RFID tag 80 of an embodiment.

As illustrated in FIG. 3, an insulating resist 100 is formed on a stainless plate 90 and is partially removed from the part where the antenna 20, a pad on which an IC chip 30 is mounted, and the like are to be formed.

Figure 4:
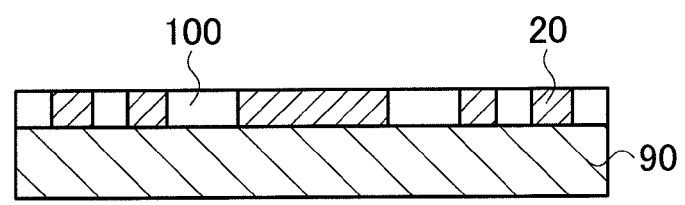
FIG. 4 is a view for explaining the method of manufacturing the RFID tag 80 of the embodiment.

Next, as illustrated in FIG. 4, the part where the resist 100 is removed is plated with metal by a plating process to provide a metallic layer for forming the antenna 20 and the like.

Figure 5:
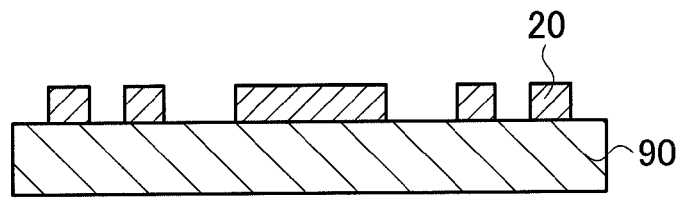
FIG. 5 is a view for explaining the method of manufacturing the RFID tag 80 of the embodiment.

Thereafter, when all the resist 100 is removed as illustrated in FIG. 5, metallic wires including the antenna 20 are left on the stainless plate 90. The pad on which the IC 30 is to be mounted is also left on the stainless plate 90.

Figure 6:
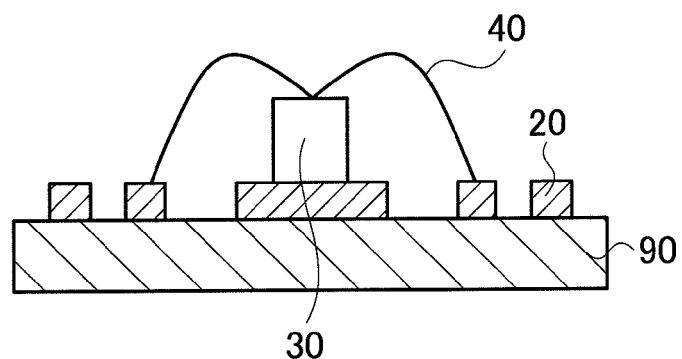
FIG. 6 is a view for explaining the method of manufacturing the RFID tag 80 of the embodiment.

Next, as illustrated in FIG. 6, the IC chip 30 is fixed with a die bond film (not shown) on the pad on which the IC 30 is to be mounted and is electrically connected to the antenna 20 with wire bonding 40 or the like. Almost all kinds of the antenna 20 can be flip-chip connected if the interconnection places are regulated.

Herein, the metal layer constituting the pad on which the IC chip 30 is to be mounted electromagnetically shields lower part of the IC chip 30 to contribute the stable operation of high frequency oscillation in the IC chip 30. Moreover, the metal layer reduces the stress applied to the IC chip 30 in the later-described process of separating the IC chip 30 from the stainless plate 90, thus protecting the IC chip 30.

Figure 7:
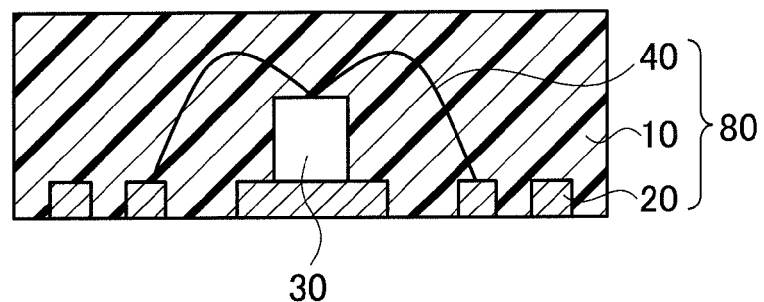
FIG. 7 is a schematic view of the RFID tag 80 of the embodiment.

The antenna 20 and IC chip 30 is sealed together with the plated metal on the stainless plate 90 with the sealing material 10, and the stainless plate 90 is separated after the sealing material is cured. The RFID tag 80 with the antenna 20 and IC chip 30 sealed in the sealing material 10 as illustrated in FIG. 7 can be thus produced.

Figure 8:
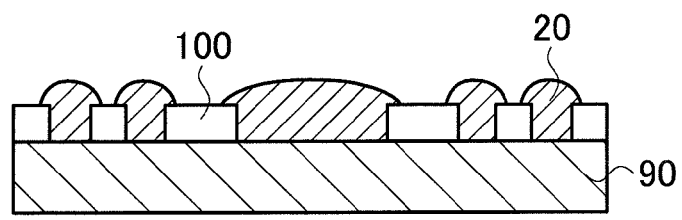
FIG. 8 is a view for explaining the method of manufacturing the RFID tag 80 of the embodiment.

In the plating process of FIG. 4, the height of the metal of the antenna 20 and the like, which are formed by plating, is set higher than the height of the resist 100 as illustrated in FIG. 8, so that metal of the antenna 20 and the like have a cap shape like a mushroom. The metal of the antenna 20 provided as described above is surely caught by the sealing material 10 when the stainless plate 90 is separated from the antenna 20, thus effectively preventing the trouble of a part or all of the metal remaining on the stainless plate 90.

Preferably, the plated metal can be metal mainly composed of nickel. This is because the antenna 20 and the like mainly composed of nickel can be formed by plating and can be easily separated from the stainless plate 90.

Figure 9:
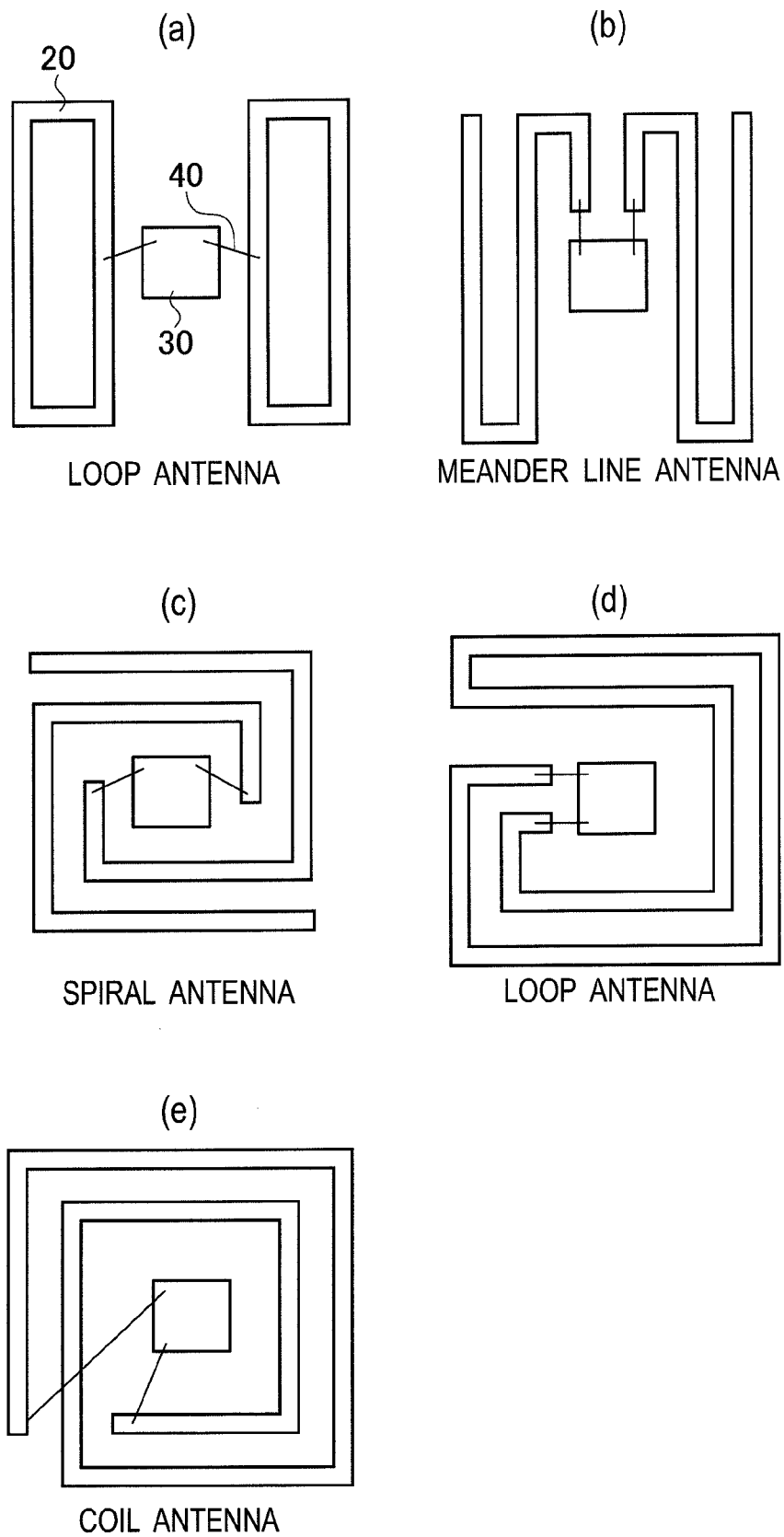
FIGS. 9A to 9E are views illustrating shapes of an antenna 20 of the RFID tag 80 of the embodiment.

Representative examples of the shape of the antenna 20 are shown in FIGS. 9A to 9E. FIGS. 9A to 9E also illustrate the IC chip 30 and wires 40 wire-bonded. The shape of the antenna 20 can be a shape of meander line antennas, loop antennas, and the like, which are widely used as an antenna. FIG. 9A shows a loop antenna; FIG. 9B, a meander line antenna; FIG. 9C, a spiral antenna; FIG. 9D, another type of loop antenna: and FIG. 9E, a coil antenna.

The antenna of a coil shape, in particular, can be miniaturized as an antenna for the RFID 80. The design method of the antenna 20 is described later. When the antenna 20 is a coil-shaped antenna, the antenna 20 can be provided by mounting a winding coil with an adhesive or the like. However, the coil-shaped antenna 20 which is formed by plating after the resist is formed like the present invention has more stable performances including inductance than the winding coil. Moreover, fine wires with a line width of 0.05 mm or the like can be formed by plating, and the plating process is advantageous for miniaturization. Furthermore, the plating process is excellent in mass production and is industrially effective.

When the antenna 20 is designed to have the aforementioned shape, the antenna 20 includes constituent portions adjacent to each other with a gap therebetween, and with contribution of the dielectric constants of the base material 1 and sealing material 10, the adjacent constituent portions are capacitively coupled to provide a capacitance therebetween. Accordingly, the effective capacitance, which is a substantial capacitance of the entire structure including the IC chip 30 and the antenna placed in the part around the IC chip 30, is considerably higher than the capacitance of the IC chip 30 alone. Herein, the substantial capacitance refers to a capacitance provided by the IC chip 30 in the structure in which the antenna is provided in the part around the IC chip 30.

FIG. 7 is a cross-sectional view illustrating the RFID tag 80 after sealing. The IC chip 30, antenna 20, and wires 40 are sealed together to be protected. Since the wires 40 for wire bonding are also sealed, the thickness or height of the sealed RFID tag 80 is about 0.2 to 1.0 mm.

The sealing material 10 can be a sealing material usually used in semiconductors and has a dielectric constant of about 2.6 to 4.5. In order to provide a higher performance of the semiconductor package itself, it is more preferable that the sealing material 10 has a lower dielectric constant. However, when the dielectric constant increases, the inductance increases, and the antenna 20 can be miniaturized.

In the RFID tag 80 of the present invention, the stainless plate 90, which corresponds to a conventional substrate, is separated, and metal wires are exposed. The RFID tag 80 does not include a protection layer and can be made thinner accordingly. For example, RFID suppliers can therefore provide the thin RFID tags 80 to manufactures of semiconductor packages and the like, where the RFID tags 80 are integrally sealed within the semiconductor packages or the like so that the metallic portions are not exposed in the surfaces.

In each RFID tag 80, the metallic portions exposed in the surface is subjected to anti-corrosion treatment for reducing corrosion of metal. Alternatively, in the case of using the RFID 80 alone, insulating resist or the like is provided on the surface of the RFID tag 80 where metal of the antenna 20 and the like is exposed, so that the metal wire portions of the IC chip 30, antenna 20, and the like are sealed into a structure which cannot be externally touched. This increases safety and reliability of the RFID tag 80 in terms of environmental deterioration and also counterfeit prevention.

The RFID tag 80 thus manufactured is compact but incorporates an antenna and an IC chip in itself. Accordingly, it is unnecessary to solder or electrically connect terminals to external parts (a substrate with an antennal pattern formed, for example) and the like. In other words, the RFID 80 is convenient enough for any user to easily attach to an object which is intended to be managed, with adhesive or tape without using a special device or part.

The heat resistance of the RFID tag 80 is substantially determined by the performance of the sealing material 10. The sealing material 10 is resistant to heat of 250 to 300° C. for a few seconds and is steadily resistant to heat of not less than 150° C. Accordingly, the RFID tag 80 has a higher heat resistance than conventional RFID tags including antennas on PET or the like have and can operate normally even at high temperature.

The IC chip 30 can be a read-only IC chip but is preferably an IC chip in which information can be written. Such an IC chip is suitable for management because the operation history can be written in the IC chip as needed.

<Design Method of Antenna 20>

The antenna 20 is designed based on the resonant frequency which is determined by the shape, line thickness, line length, and the like of the antenna conductor. By bringing the resonant frequency close to the operation frequency of the employed IC chip 30, the antenna 20 receives power from a reader/writer and transmits the same to the IC chip 30, and the IC chip 30 then operates.

Generally, it is difficult to analytically derive the resonant frequency from the drawings of an antenna. Actually, the resonant frequency is obtained by experimental measurement using an antenna manufactured experimentally or by using an electromagnetic simulator in many cases. The invented RFID tag 80 is compact in particular, and it is impossible to produce an antenna accurately by handwork. The trial and error approach requires a lot of time and cost to manufacture samples by the method of forming the resist 100 and forming the metallic antenna 20 by plating, evaluate the manufactured samples, and feed back the results thereof. Accordingly, in this specification, the antenna 20 is designed by using an electromagnetic simulator (simulator software HFSS made by ANSYS Japan K. K.) to reduce the time and cost. The simulator requires at least inputs of the shape and material of the antenna 20, the capacitance of the IC chip 30, the shape and refractive index of the sealing material 10, conductors corresponding to the wires 40, and a power port corresponding to the IC chip 30, and the result of simulation provides the resonant frequency. The resonant frequency in this case refers to a frequency at which the imaginary part of the impedance of the circuit is equal to zero.

Figure 10:
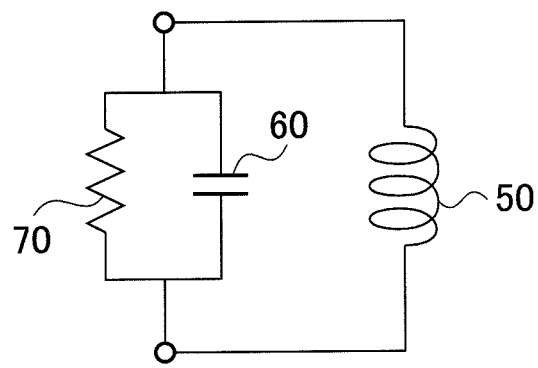
FIG. 10 is a diagram showing an electrically equivalent circuit to a coil antenna 20 connected to an IC chip 30.

The way of easily understand the design principal is to give consideration to an electrically closed circuit obtained when the IC chip 30 is connected to both ends of the coil-shaped antenna 20, which can be considered equivalent to a simple LC resonant circuit. FIG. 10 shows the electrically equivalent circuit of the coil-shaped antenna 20 of FIG. 9E. A resonant frequency $f_0$ in this case is expressed by the following equation (1) together with inductance L of a coil 50, which is an equivalent circuit of the coil-shaped antenna 20, and capacitance C of a capacitor 60, which is an equivalent circuit of the IC chip 30.

[Equation 1]

$$(2\pi f_0)^2 = \frac{1}{LC} \quad (1)$$

Herein, C can change depending on the choice of the IC chip 30, and L can be adjusted by changing the shape of the coil-shaped antenna (especially the diameter and the number of turns of the coil-shaped antenna 20). This can provide the intended resonant frequency $f_0$. The adjustment of L is especially effective. If the inductance L is increased by increasing the diameter or the number of turns of the coil-shaped antenna 20, $f_0$ is reduced.

In the above equation, the capacitance C of the IC chip 30 is the effective capacitance of the structure where the antenna 20 (coil 50) is placed in the part around the IC chip 30. In this embodiment, capacitance components are generated between the adjacent constituent portions of the antenna 20 with a gap therebetween, and furthermore, with contribution of the dielectric constants of the base material 1 and sealing material 10, the antenna 20 yields a capacitance. Accordingly, the effective capacitance which is a substantial capacitance of the entire structure where the antenna 20 (coil 50) is arranged in the part around the IC chip 30 is considerably higher than the capacitance of the IC chip 30 alone. As apparent from the above equation, the desired resonant frequency $f_0$ can be generated with a smaller inductance L. Accordingly, the coil 50 can be reduced in size by reducing the diameter or the number of turns, thus miniaturizing the entire RFID tag 80.

However, the desired resonant frequency cannot be generated when the RFID tag 80 has a size within the targeted size in some cases: when the employed IC chip 30 is specified; when the area on which the antenna 20 is mounted is limited to a small area and when the line width of the antenna 20 cannot be made very thin because of process reasons.

The precise equivalent circuit is more complicated than that expressed by Equation (1) because the coil-shaped antenna 20 includes stray capacitance C' between lines.

The resonant frequency (operation frequency) of the RFID tag 80 (IC chip 30) is preferably in a range from 13.56 MHz to 2.48 GHz, which is especially commercially useful in the Radio Act. In the case of RFID tags having an operation frequency of 0.86 to 0.96 GHz in the ultra high frequency band (UHF) in particular, the wavelength of the radio waves is about 30 cm. On the other hand, normal IC chips for the UHF band have a size of 0.6 mm square or smaller, and it is impossible to form an antenna allowing the IC chip to normally operate on the IC chip for the UHF by the on-chip antenna method. However, the method of the present invention has such an excellent characteristic that an RFID tag can operate using a single-layer antenna of a size of only several mm square instead of using a conventional antenna of a size of several cm square. Moreover, the antenna employed in the present invention has a size of several mm square and has a conductor width/conductor interval of several tens to several hundreds μm and can be therefore easily formed by etching a metal layer such as copper foil or by another method. Furthermore, the antenna of the present invention can be a single-layer antenna and does not need to be formed into a multilayer structure. Accordingly, the antenna of the present invention can be formed of copper foil of a polyimide base material with copper foil, in which copper foil as a metal layer is attached on one side of the base material. Accordingly, the RFID tag 80 can be formed by a general-purpose process using a general-purpose low-cost material.

The RFID tag 80 of the present invention can be embedded in a semiconductor device or the like for use. Moreover, the RFID tag 80 can be attached to a product or a sample with double-sided tape like a label for use in management or the like and can be easily detached at the time of selling the product.

EXAMPLES

Reading Evaluation Method and Experiment Results

The used reader writer was UI-9061 (output: 1 W) made by LSIS Co., Ltd. The reading evaluation of the RFID tag 80 was performed with no obstacles in an area 25 cm square around the reading unit of the reader/writer. Measurement was performed in terms of the maximum distance between the reading unit of the reader/writer and the RFID tag 80 at which the reader/writer could read the RFID tag 80 (hereinafter, referred to as reading distance). Each IC chip used in the evaluation had a size of about 0.5 by 0.5 by 0.1 mm, a capacitance of 0.77 pF, and an operation frequency of about 0.86 to 0.96 GHz.

Figure 11:
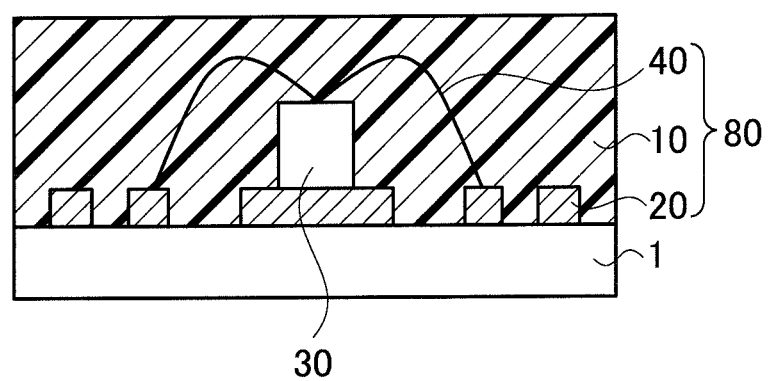
FIG. 11 is a schematic view of the RFID tag used in experiments.

Table 1 includes results showing values obtained by measuring samples when the reading distance was the longest, each sample being obtained by forming the antenna 20 on a polyimide substrate 1 by etching, wire-bonding the IC chip 30 operating in the UHF band, and then sealing the same as illustrated in FIG. 11.

In Table 1, the resonant frequencies of coil antennas and loop antennas 2, each of which was connected to an IC chip to form an electrically closed circuit, were 0.2 to 2 GHz by the electromagnetic simulator, which were substantially closer to the operation frequency of 0.9 GHz of the IC chip than those of the other antennas. The reading distances thereof provided better results than those of meander line antennas, loop antennas 1, and spiral antennas, which did not constitute an electrically closed circuit. Examples 1a, 1b, 2a, 2b, 3b, 4c, and 5c, the resonant frequencies of which were 0.5 to 1.5 GHz, had communication distances of not less than 5 mm. Especially Examples 1a, 2b, and 3b, the resonant frequencies of which were 1 to 1.1 GHz (that is closer to the operation frequency of 0.9 GHz of the IC chips), had communication distances of more than 20 mm (the maximum reading distance was 37 mm).

TABLE 1

| EXAMPLES | | ANTENNA SHAPE | RFID TAG OUTER SIZE (mm) | CONDUCTOR WIDTH/CONDUCTOR INTERVAL (mm) | NUMBER OF TURNS | SIMULATION RESONANT FREQUENCY (GHz) | READING DISTANCE (mm) |
|---|---|---|---|---|---|---|---|
| EXAMPLE 1 | a | Coil | 4 × 4 | 0.2/0.2 | 3 | 1 | 37 |
| | b | Coil | 4 × 4 | 0.1/0.1 | 7 | 0.5 | 8 |
| | c | Coil | 4 × 4 | 0.05/0.05 | 14 | 0.2 | 3 |
| EXAMPLE 2 | a | Loop 2 | 4 × 4 | 0.2/0.2 | — | 1.5 | 10 |
| | b | Loop 2 | 4 × 4 | 0.1/0.1 | — | 1.1 | 21 |
| | c | Loop 2 | 4 × 4 | 0.05/0.05 | — | 0.7 | 3 |
| COMPARATIVE EXAMPLE 2 | a | Meander Line | 4 × 4 | 0.2/0.2 | — | 8 | — |
| | b | Meander Line | 4 × 4 | 0.1/0.1 | — | 6 | — |
| | c | Meander Line | 4 × 4 | 0.05/0.05 | — | 6 | — |
| COMPARATIVE EXAMPLE 2 | a | Loop 1 | 4 × 4 | 0.2/0.2 | — | 11 | — |
| | b | Loop 1 | 4 × 4 | 0.1/0.1 | — | 11 | — |
| | c | Loop 1 | 4 × 4 | 0.05/0.05 | — | 8 | — |
| COMPARATIVE EXAMPLE 3 | a | Spiral | 4 × 4 | 0.2/0.2 | — | 4 | — |
| | b | Spiral | 4 × 4 | 0.1/0.1 | — | 2 | — |
| | c | Spiral | 4 × 4 | 0.05/0.05 | — | 1.5 | 1 |
| EXAMPLE 3 | b | Coil | 2.5 × 2.5 | 0.1/0.1 | 4 | 1.1 | 22 |
| EXAMPLE 4 | c | Loop 2 | 2.5 × 2.5 | 0.05/0.05 | — | 1.5 | 5 |
| COMPARATIVE EXAMPLE 4 | a | Meander Line | 2.5 × 2.5 | 0.2/0.2 | — | 14 | — |
| | b | Meander Line | 2.5 × 2.5 | 0.1/0.1 | — | 12 | — |
| | c | Meander Line | 2.5 × 2.5 | 0.05/0.05 | — | 11 | — |
| COMPARATIVE EXAMPLE 5 | a | Loop 1 | 2.5 × 2.5 | 0.2/0.2 | — | 15 | — |
| | b | Loop 1 | 2.5 × 2.5 | 0.1/0.1 | — | 15 | — |
| | c | Loop 1 | 2.5 × 2.5 | 0.05/0.05 | — | 13 | — |
| COMPARATIVE EXAMPLE 6 | a | Spiral | 2.5 × 2.5 | 0.2/0.2 | — | 8 | — |
| | b | Spiral | 2.5 × 2.5 | 0.1/0.1 | — | 5 | — |
| | c | Spiral | 2.5 × 2.5 | 0.05/0.05 | — | 4 | — |
| EXAMPLE 5 | c | Coil | 1.9 × 1.9 | 0.05/0.05 | 5 | 0.9 | 15 |

Herein, when the RF tag 80 had a size of not less than 4 mm long by not less than 4 mm wide, the height thereof can be made 0.4 mm or less. When the RF tag 80 had a size of not less than 2.5 mm long by not less than 2.5 mm wide, the height thereof can be made 0.3 mm or less. When the RF tag 80 had a size of not less than 1.9 mm long by not less than 1.9 mm wide, the height thereof can be made 0.3 mm or less.

Table 2 shows measurement results of the reading distance of samples illustrated in FIG. 7 according to the present invention. The measurement was performed for 20 pieces of each type of RFID tags 80 including the antennas 20 having substantially the same size and shape as those of the two types of samples providing good reading performance in Table 1. The reading distances of 4 mm square samples and 2.5 mm square samples were 29.5 mm and 19.9, respectively.

TABLE 2

|  | | ANTENNA SHAPE | RFID TAG OUTER SIZE (mm) | CONDUCTOR WIDTH/CONDUCTOR INTERVAL (mm) | NUMBER OF TURNS | SIMULATION RESONANT FREQUENCY (GHz) | NUMBER OF SAMPLES | AVERAGE READING DISTANCE (mm) |
|---|---|---|---|---|---|---|---|---|
| EXAMPLE 1 | a | Coil | 4 × 4 | 0.2/0.2 | 3 | 1 | 21 | 29.5 |
| EXAMPLE 3 | b | Coil | 2.5 × 2.5 | 0.1/0.1 | 4 | 1.1 | 19 | 19.9 |

The antennas 20 can be more stably manufactured at a higher yield when the conductor width and the conductor interval are thicker. Accordingly, in the case where the conductor width and conductor intervals are determined by the process restrictions, it was considered how small the antenna 20 could be while ensuring a reading distance of not less than several cm. The consideration revealed that the outer size of the RFID 80 could be reduced to about 4 mm square at minimum when the conductor width/conductor interval was 0.2/0.2 mm. Moreover, it was revealed that the outer size of the RFID 80 could be reduced to about 2.5 mm square at minimum when the conductor width/conductor interval was 0.1/0.1 min. Moreover, it was revealed that the outer size of the RFID 80 could be reduced to about 1.9 mm square at minimum when the conductor width/conductor interval was 0.05/0.05 mm.

Table 3 shows the simulation results and experiment results when IC chips having a size of about 0.5 by 0.5 by 0.1 mm, an operation frequency of 13.56 MHz, and a capacitance of 17 pF were employed. Example 6b, the resonant frequency of which was 29 MHz by the electromagnetic simulator, had a communication distance of 12 mm. Especially Example 7b, the resonant frequency of which was 14 MHz by the electromagnetic simulator, had a communication distance of 110 mm. When the operation frequency was 13.56 MHz in the high frequency band (HF band), which was lower than the UHF band, the inductance of the coil-shaped antenna 20 needs to be made higher. It was revealed that the outer size of the RFID 80 could be reduced to about 13 mm square at minimum when the conductor width/conductor interval was 0.1/0.1 min.

TABLE 3

|  | | ANTENNA SHAPE | RFID TAG OUTER SIZE (mm) | CONDUCTOR WIDTH/CONDUCTOR INTERVAL (mm) | NUMBER OF TURNS | SIMULATION RESONANT FREQUENCY (MHz) | READING DISTANCE (mm) |
|---|---|---|---|---|---|---|---|
| EXAMPLE 6 | b | Coil | 99 | 0.1/0.1 | 20 | 29 | 12 |
| EXAMPLE 7 | b | Coil | 13 × 13 | 0.1/0.1 | 30 | 14 | 110 |

Herein, when the size of the RFID tag 80 was not less than 13 mm long by not less than 13 mm wide, the height thereof can be 1.0 mm or less.

Table 4 shows the simulation results and experiment results when IC chips having a size of about 0.5 by 0.5 by 0.1 mm, an operation frequency of 2.45 GHz, and a capacitance of 0.7 pF were employed. Example 8a, which had a resonant frequency of 2 GHz by the electromagnetic simulator, and Example 9b, which had a resonant frequency of 2.1 GHz by the electromagnetic simulator, provided communication distances of 4 mm. It was therefore revealed that the outer size of the RFID 80 could be reduced to about 1.9 mm square at minimum when the conductor width/conductor interval was 0.1/0.1 mm.

TABLE 4

|  | | ANTENNA SHAPE | RFID TAG OUTER SIZE (mm) | CONDUCTOR WIDTH/CONDUCTOR INTERVAL (mm) | NUMBER OF TURNS | SIMULATION RESONANT FREQUENCY (GHz) | READING DISTANCE (mm) |
|---|---|---|---|---|---|---|---|
| EXAMPLE 8 | a | coil | 2.5 × 2.5 | 0.2/0.2 | 2 | 2 | 4 |
| EXAMPLE 9 | b | coil | 1.9 × 1.9 | 0.1/0.1 | 2 | 2.1 | 4 |

INDUSTRIAL APPLICABILITY

The RFID tag of the present invention can be used for the purposes of management, identification, information presentation, information recording, and counterfeit prevention of products including commercial goods, packages, cards, documents, glasses, watches (especially small watches such as wristwatches), semiconductors, and medical uses (samples obtained from patients).

EXPLANATION OF REFERENCE NUMERALS

1 SUBSTRATE
10 SEALING MATERIAL
20 ANTENNA
30 IC CHIP
40 WIRE OF WIRE BONDING
50 COIL (ANTENNA)
60 CAPACITANCE (IC CHIP)
70 RESISTANCE (IC CHIP, PORT SET AT SIMULATION)
80 RFID TAG
90 STAINLESS PLATE
100 RESIST

The invention claimed is:
1. An RFID tag comprising:
   a single-layer antenna;
   an IC chip having a size of 0.6 mm square or smaller which is connected to the antenna with wire bonding so as not to overlap the antenna; and a sealing material sealing the IC chip and the antenna, wherein the antenna is a coil antenna arranged in a part around the IC chip and including constituent portions adjacent to each other with a gap therebetween, the sealing material being arranged in the gap of the antenna, the antenna has a cap shape of a mushroom in section, a conductor interval to conductor width of the antenna is in a range of 0.2 mm to 0.2 mm to 0.05 mm to 0.05 mm, and a resonant frequency $f_o$ of an electric circuit including an inductance L of the antenna and a capacitance C of the IC chip is equal to or close to an operation frequency of the IC chip.

2. The RFID tag according to claim 1, wherein the operation frequency of the IC chip is 0.86 to 0.96 GHz while the resonant frequency $f_0$ of the electric circuit including the inductance L of the antenna and the capacitance C of the IC chip is 0.2 to 2 GHz, or the operation frequency of the IC chip is 13.56 MHz while the resonant frequency $f_0$ is 13.56 to 29 MHz, or the operation frequency of the IC chip is 2.45 GHz while the resonant frequency $f_0$ is 2 to 2.45 GHz.

3. The RFID tag according to claim 1, wherein the RFID tag has a size of not more than 13 mm long by not more than 13 mm wide by not more than 1.0 mm high, a size of not more than 4 mm long by not more than 4 mm wide by not more than 0.4 mm high, a size of not more than 2.5 mm long by not more than 2.5 mm wide by not more than 0.3 mm high, or a size of not more than 1.9 mm long by not more than 1.9 mm wide by not more than 0. 3 mm high.

4. The RFID tag according to claim 1, wherein the operation frequency band is 13.56 MHz to 2.48 GHz.

5. The RFID tag according to claim 1, wherein the operation frequency band is 0.86 to 0.96 GHz.

6. The RFID tag according to claim 1, wherein the sealing material has a dielectric constant of not less than 2.6.

7. The RFID tag according to claim 1, wherein the sealing material is mainly composed of epoxy, carbon, and silica to enhance the heat resistance of the RFID tag.

8. The RFID tag according to claim 1, wherein the RFID includes the antenna, the IC chip connected to the antenna, and the sealing material sealing the IC chip and the antenna, and the antenna is obtained by forming a pattern with a resist on a stainless plate, providing metal in a portion not including the resist by plating, removing the resist, mounting the IC chip, electrically connecting the metal and the IC chip, sealing the metal and the IC chip with the sealing material, and separating only the stainless plate.

9. The RFID tag according to claim 8, wherein the metal provided by plating is thicker in the central side of the RFID tag than in the surface side thereof.

10. The RFID tag according to claim 1, wherein capacitance components are generated between the adjacent constituent portions of the antenna with the gap therebetween, and furthermore, with contribution of the dielectric constant of the sealing material arranged in the gap of the antenna, the constituent portions of the antenna with the gap yield a capacitance, and thereby the effective capacitance that is a substantial capacitance of the entire structure, where the antenna is arranged in the part around the IC chip, is higher than the capacitance of the chip alone.

11. The RFID tag according to claim 1, wherein a resonant frequency $f_o$ of an electric circuit including the inductance L of the antenna and the capacitance C of the IC chip is a resonant frequency given by an electromagnetic simulator using equation 1 as below:

$$\left(2\pi f_0\right)^2 = \frac{1}{LC}. \quad (1)$$

12. An RFID tag comprising:

a single-layer antenna;

an IC chip having a size of 0.6 mm square or smaller which is provided on a metal layer and is electrically connected to the antenna with wire bonding; and a sealing material sealing the IC chip and the antenna, wherein the antenna is a coil antenna arranged in a part around the IC chip and including constituent portions adjacent to each other with a gap therebetween, the sealing material being arranged in the gap of the antenna, the antenna has a cap shape of a mushroom in section, a conductor interval to conductor width of the antenna is in a range of 0.2 mm to 0.2 mm to 0.05 mm to 0.05 mm, and a resonant frequency $f_o$ of an electric circuit including an inductance L of the antenna and a capacitance C of the IC chip is equal to or close to an operation frequency of the IC chip.

13. The RFID tag according to claim 12, wherein the operation frequency of the IC chip is 0.86 to 0.96 GHz while the resonant frequency $f_0$ of the electric circuit including the inductance L of the antenna and the capacitance C of the IC chip is 0.2 to 2 GHz, or the operation frequency of the IC chip is 13.56 MHz while the resonant frequency $f_0$ is 13.56 to 29 MHz, or the operation frequency of the IC chip is 2.45 GHz while the resonant frequency $f_0$ is 2 to 2.45 GHz.

14. The RFID tag according to claim 12, wherein the RFID tag has a size of not more than 13 mm long by not more than 13 mm wide by not more than 1.0 mm high, a size of not more than 4 mm long by not more than 4 mm wide by not more than 0.4 mm high, a size of not more than 2.5 mm long by not more than 2.5 mm wide by not more than 0.3 mm high, or a size of not more than 1.9 mm long by not more than 1.9 mm wide by not more than 0.3 mm high.

15. The RFID tag according to claim 12, wherein the operation frequency band is 13.56 MHz to 2.48 GHz.

16. The RFID tag according to claim 12, wherein the operation frequency band is 0.86 to 0.96 GHz.

17. The RFID tag according to claim 12, wherein the sealing material has a dielectric constant of not less than 2.6.

18. The RFID tag according to claim 12, wherein the sealing material is mainly composed of epoxy, carbon, and silica to enhance the heat resistance of the RFID tag.

19. The RFID tag according to claim 12, wherein the RFID includes the antenna, the IC chip connected to the antenna, and the sealing material sealing the IC chip and the antenna, and the antenna is obtained by forming a pattern with a resist on a stainless plate, providing metal in a portion not including the resist by plating, removing the resist, mounting the IC chip, electrically connecting the metal and the IC chip, sealing the metal and the IC chip with the sealing material, and separating only the stainless plate.

20. The RFID tag according to claim 19, wherein the metal provided by plating is thicker in the central side of the RFID tag than in the surface side thereof.

21. The RFID tag according to claim 12, wherein capacitance components are generated between the adjacent constituent portions of the antenna with the gap therebetween, and furthermore, with contribution of the dielectric constant of the sealing material arranged in the gap of the antenna, the constituent portions of the antenna with the gap yield a capacitance, and thereby the effective capacitance that is a substantial capacitance of the entire structure, where the antenna is arranged in the part around the IC chip, is higher than the capacitance of the chip alone.

22. The RFID tag according to claim 12, wherein said metal layer upon which the IC chip is provided, is made from a same metal layer from which the single-layer antenna is formed.

23. The RFID tag according to claim 12, wherein
a resonant frequency $f_o$ of an electric circuit including the inductance L of the antenna and the capacitance C of the IC chip is a resonant frequency given by an electromagnetic simulator using equation 2 as below:

$$\left(2\pi f_0\right)^2 = \frac{1}{LC}. \qquad (2)$$

* * * * *